United States Patent
Novellini (10) Patent No.: US 8,666,010 B1
(45) Date of Patent: Mar. 4, 2014

(54) PHASE DETECTOR FOR BURSTY DATA STREAMS

(71) Applicant: Xilinx, Inc., San Jose, CA (US)

(72) Inventor: Paolo Novellini, Gorgonzola (IT)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/625,100

(22) Filed: Sep. 24, 2012

(51) Int. Cl.
*H04L 7/00* (2006.01)

(52) U.S. Cl.
USPC ........... 375/371; 375/375; 375/376; 327/147; 327/157

(58) Field of Classification Search
USPC .......... 375/371, 373, 375, 376; 327/147, 150, 327/152, 154, 155, 156, 159
See application file for complete search history.

(56) References Cited

U.S. PATENT DOCUMENTS

| | | | | |
|---|---|---|---|---|
| 6,275,553 | B1 * | 8/2001 | Esaki | 375/371 |
| 7,039,149 | B2 * | 5/2006 | Tagami | 375/376 |
| 7,576,576 | B2 * | 8/2009 | Drexler et al. | 327/156 |
| 2008/0124092 | A1 | 5/2008 | Dvir et al. | |

OTHER PUBLICATIONS

U.S. Appl. No. 13/111,868, filed May 19, 2011, Novellini.
Maxim, 622Mbps/1233Mbps Burst-Mode Clock Phase Aligner for GPON OLT Applications MAX3634, Rev. 0, Sep. 2005, Maxim, Sunnyvale, California, USA.

* cited by examiner

*Primary Examiner* — Dac Ha
(74) *Attorney, Agent, or Firm* — Gerald Chan; Lois D. Cartier (57) ABSTRACT

A bursty phase detector comprises upper and lower branches. The upper branch includes a voltage-controlled oscillator (VCO) providing a VCO phase; a phase detector with a first input for receiving a data stream and a second input coupled to the output of the VCO, the phase detector providing a phase error; a sample selector with a first input for receiving a sum of the VCO phase and the phase error, and a second input coupled to receive the data stream, the sample selector providing a data stream sample; a signal stream detector with a first input for receiving the sum of the VCO phase and the phase error, and a second input coupled to the output of the sample selector, the signal stream detector generating a data stream phase and a data stream detect signal. The lower branch includes a delay component with an input for receiving the data stream.

20 Claims, 5 Drawing Sheets

PHASE DETECTOR FOR BURSTY DATA STREAMS

TECHNICAL FIELD

An embodiment described herein relates generally to a phase detector, and in particular to a phase detector for processing data streams of a bursty data system.

BACKGROUND

Bursty data systems involve several transmitters communicating with a single receiver over a shared medium using a technique known as time-sharing. In a bursty data system, different transmitters are provided different time slots during which they can communicate exclusively with the receiver. The transmitters in the bursty data system all transmit data at the same frequency, but different phases. For a receiver to accurately process the data being transmitted by a transmitter, the phase of the data stream must be quickly detected in order for the receiver to accurately sample data from the data stream. Acquiring the phase of the data stream allows the receiver to sample data from the data stream at points where the signal representing the data stream is more reliable (e.g., less affected by local noise). The time it takes for the receiver to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between transmitter and receiver), a phase-locked-loop (PLL) is used at the receiver to perform phase detection on incoming data. The PLL includes a phase detector that compares the incoming data stream to phase information output by a voltage controlled oscillator (VCO) to generate an error phase of the data relative to the phase information output by the VCO. The error phase is fed back to the VCO, which updates its phase information to account for the error, and this process continues until the phase information output by the VCO is in sync with the data stream.

One technique for utilizing a PLL for a bursty data system involves appending a preamble to the beginning of a data stream being transmitted from a transmitter to the receiver. The preamble is a fixed length of bits that are used by the receiver to perform phase detection prior to sampling the data stream. Although the PLL will eventually detect the phase of the data stream using the preamble, it does so very slowly, and as such a long preamble length is required to ensure that the phase of the data stream is accurately detected before sampling of the data stream occurs. This technique is undesirable for use within a bursty data system because it requires a long preamble length which leads to an inefficient usage of bandwidth and a long locking time. Moreover, this technique fails to take into account that each transmitter is only allocated a fixed time segment within which its transmitted data stream must be sampled, and a long preamble will lead to too much of the time segment being utilized for phase detection.

Another technique involves utilizing dedicated circuitry in combination with a PLL for performing phase detection. A data stream is initially transmitted from a transmitter to the receiver with a preamble with a fixed pattern appended to the beginning of the data stream. Dedicated circuitry at the receiver is used to perform phase detection on the preamble and steer a VCO of the PLL in order to accurately sample the data stream. The size of the preamble is determined by the speed of the dedicated circuitry. By increasing the speed of the dedicated circuitry, the time it takes to detect the phase from the preamble can be decreased. Even though the locking time is reduced with this technique, it requires the use of dedicated circuitry operating at a very fast speed which can become quite costly. Moreover, even though preamble length can be reduced, a positive locking time is still required in order to accurately perform sampling of the data stream.

Another technique involves using a zero preamble length to perform phase detection on a data stream, but requires that the transmitters communicate with the receiver in a predictable cyclical manner.

SUMMARY

In some embodiments, a bursty phase detector for processing a data stream, comprises an upper branch and a lower branch. The upper branch includes a voltage-controlled oscillator (VCO) configured to provide a VCO phase at an output of the VCO; a phase detector with a first input coupled to receive the data stream and a second input coupled to the output of the VCO, the phase detector configured to provide a phase error at its output; a sample selector with a first input coupled to receive a sum of the VCO phase and the phase error, and a second input coupled to receive the data stream, the sample selector configured to provide a data stream sample at its output; and a signal stream detector with a first input coupled to receive the sum of the VCO phase and the phase error, and a second input coupled to the output of the sample selector, the signal stream detector configured to generate a data stream phase and a data stream detect signal. The lower branch includes a delay component with an input coupled to receive the data stream.

In other embodiments, a receiver for processing a data stream comprises a bursty phase detector including an upper branch and a lower branch. The upper branch comprises: a first voltage-controlled oscillator (VCO) configured to provide a first VCO phase at an output of the VCO; a first phase detector with a first input coupled to receive the data stream, and a second input coupled to the output of the first VCO, the first phase detector configured to provide a first phase error at its output; a sample selector with a first input coupled to receive a sum of the first VCO phase and the first phase error, and a second input coupled to receive the data stream, the sample selector configured to provide a data stream sample at its output; and a signal stream detector with a first input coupled to receive the sum of the first VCO phase and the first phase error, and a second input coupled to the output of the sample selector, the signal stream detector configured to generate a data stream phase and a data stream detect signal. The lower branch comprises a delay component with an input coupled to receive the data stream. The receiver further comprises a phase locked loop (PLL) coupled to receive an output of the delay element, the data stream phase, and the data stream detect signal, the PLL configured to provide a second VCO phase at an output of the PLL; and a data sample selector with a first input coupled to the output of the delay component, and a second input coupled to the output of the PLL.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments is rendered, and illustrated in the accompanying drawings. These drawings depict only exemplary embodiments and are not therefore to be considered limiting of its scope.

DETAILED DESCRIPTION

Various embodiments are described hereinafter with reference to the figures. It should be noted that the figures are not necessarily drawn to scale, and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated, or not so explicitly described. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiments" in various places throughout this specification are not necessarily referring to the same embodiment or embodiments.

Figure 1:
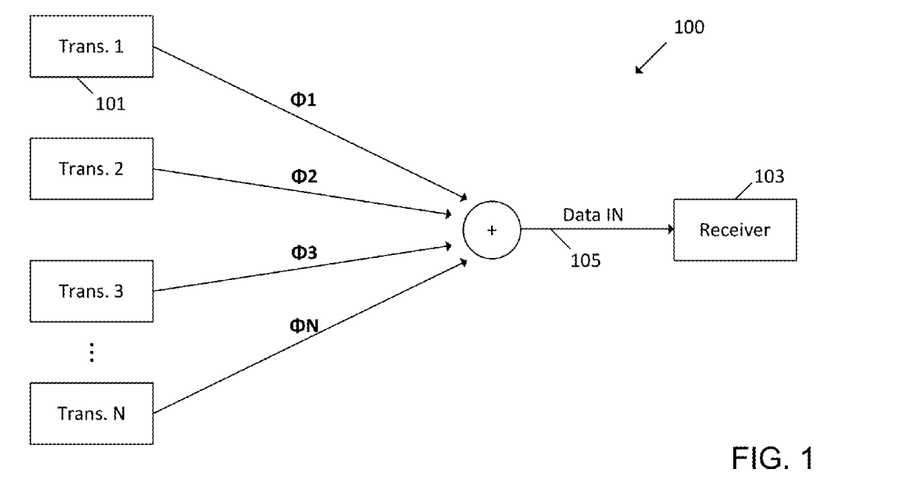
FIG. 1 illustrates an example of a bursty data system.
Figure 2:
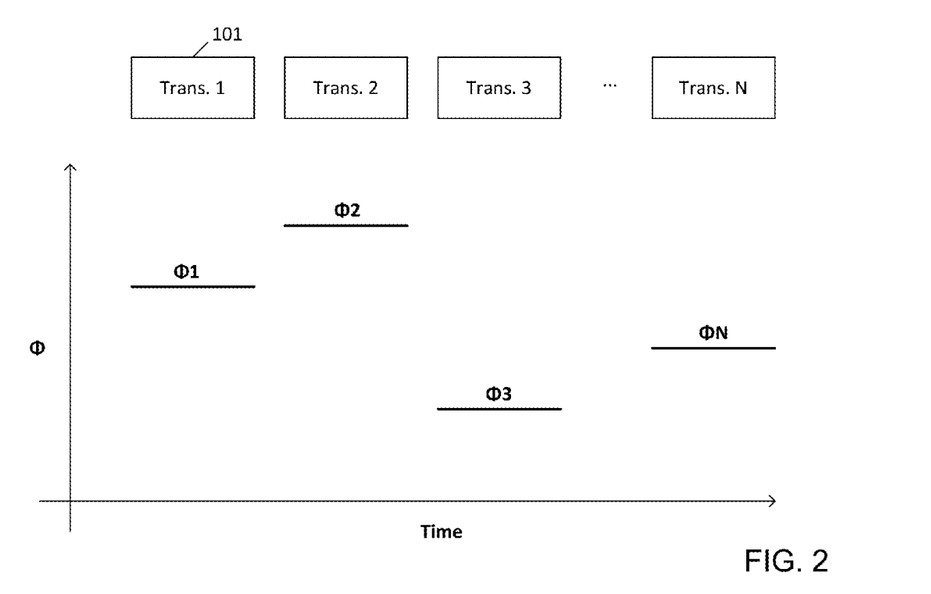
FIG. 2 illustrates an example phase profile for different clients of a bursty data system.

FIG. 1 is a block diagram illustrating an example bursty data system 100. Bursty data systems involve several transmitters 101 communicating with a single receiver 103 over a shared medium 105 using a technique known as time-sharing. In a bursty data system, different transmitters 101 are provided different time slots during which they can communicate exclusively with the receiver 103. The transmitters 101 in the bursty data system all transmit data at the same frequency, but different phases $\phi1, \phi2, \phi3, \phi N$. FIG. 2 illustrates an example phase profile for different transmitters 101 of a bursty data system. As illustrated in FIG. 2, each transmitter 101 communicates exclusively with the receiver for a given period of time during which data is transmitted at a given phase.

For a receiver 103 to accurately process the data stream being transmitted by a transmitter 101, the phase of the data stream must be quickly detected in order for the receiver 103 to accurately sample data from the data stream. Acquiring the phase of the data stream allows the receiver 103 to sample data from the data stream at points where the signals representing the data stream are more reliable (e.g., less affected by local noise). The time it takes for the receiver 103 to detect the phase of the data stream and to begin accurately sampling the data using the detected phase relative to the start of data sampling is referred to as locking time. A goal of phase detection in a bursty data system is to minimize the locking time.

For data systems that are non-bursty in nature (e.g., one to one correspondence between transmitter and receiver), a phase-locked-loop (PLL) is used at the receiver to perform phase detection on incoming data. The PLL includes a phase detector that compares the incoming data stream to phase information output by a voltage-controlled oscillator to generate an error phase of the data relative to the phase information output by the voltage-controlled oscillator. The error phase is fed back to the voltage-controlled oscillator, which updates its phase information to account for the error, and this process continues until the phase information output by the voltage-controlled oscillator is in sync with the data stream.

One technique for utilizing a PLL for a bursty data system involves appending a preamble to the beginning of a data stream being transmitted from a transmitter to the receiver. The preamble is a fixed length of bits that are used by the receiver to perform phase detection prior to sampling the data stream. Although the PLL will eventually detect the phase of the data stream using the preamble, it does so very slowly, and as such a long preamble length is required to ensure that the phase of the data stream is accurately detected before sampling of the data stream occurs. This technique is undesirable for use within a bursty data system because it requires a long preamble length which leads to an inefficient usage of bandwidth and a long locking time. Moreover, this technique fails to take into account that each transmitter is only allocated a fixed time segment within which its transmitted data stream must be sampled, and a long preamble will lead to too much of the time segment being utilized for phase detection.

Another technique involves utilizing dedicated custom circuitry in combination with a PLL for performing phase detection. A data stream is initially transmitted from a transmitter to the receiver with a preamble that includes a fixed pattern appended to the beginning of the data stream. Dedicated custom circuitry at the receiver is used to perform phase detection on the preamble and steer a voltage-controlled oscillator of the PLL in order to accurately sample the data stream. The size of the preamble is determined by the speed of the dedicated custom circuitry. By increasing the speed of the dedicated custom circuitry, the time it takes to detect the phase from the preamble can be decreased. Even though the locking time is reduced with this technique, it requires the use of dedicated custom circuitry operating at a very fast speed which can become quite costly. Moreover, even though preamble length can be reduced, a positive locking time may still be required in order to accurately perform sampling of the data stream.

Another technique involves using a zero preamble length to perform phase detection on a data stream, but requires that the transmitters communicate with the receiver in a predictable cyclical manner.

Figure 3:
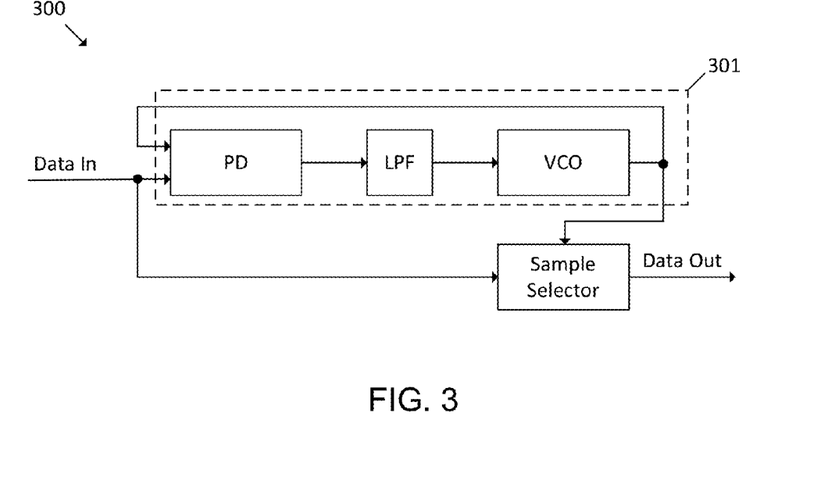
FIG. 3 illustrates a conventional receiver and its application within a bursty data system.

FIG. 3 illustrates a conventional receiver 300 and its application within a bursty data system. A conventional receiver 300 includes a phase-locked loop (PLL) 301 and a sample selector. The PLL 300 includes a phase detector PD, a low-pass filter LPF, and a voltage-controlled oscillator VCO.

The phase detector PD includes a first input coupled to receive the incoming data stream and a second input coupled to an output of the voltage-controlled oscillator VCO. The phase detector PD is configured to generate a phase error at its output.

The low-pass filter LPF includes an input coupled to the output of the phase detector PD and an output coupled to an input of the voltage-controlled oscillator VCO. The low-pass filter LPF is configured to remove local noise associated with the output of the phase detector PD (e.g. phase error).

The voltage-controlled oscillator VCO includes an input coupled to the low-pass filter LPF and an output coupled to the phase detector PD as well as the sample selector. The voltage-controlled oscillator VCO generates a VCO phase at its output.

Initially, an incoming data stream is received at the first input of the phase detector PD of the PLL 301. The voltage-controlled oscillator VCO generates a random VCO phase which is received at the second input of the phase detector PD of the PLL 301. The phase detector PD compares the phase of the incoming data stream to the VCO phase generated by the voltage-controlled oscillator VCO to generate a phase error. The phase error is passed to the low-pass filter LPF which removes local noise before being received by the voltage-controlled oscillator VCO. The voltage-controlled oscillator VCO generates an adjusted VCO phase based on the received low-pass filtered phase error. This continues until the VCO phase generated at the output of the voltage-controlled oscillator VCO is aligned with the phase of the incoming data stream.

Figure 4:
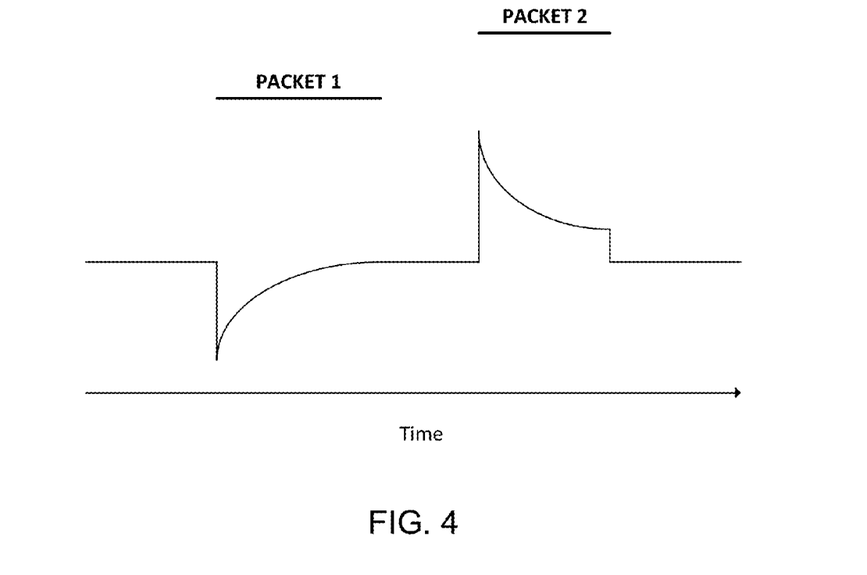
FIG. 4 illustrates the behavior of the PLL of FIG. 3.

FIG. 4 illustrates the behavior of the PLL at measurement point A of FIG. 3. FIG. 4 illustrates the behavior for two different incoming data streams (i.e., packet 1 and packet 2) with different phases. Measurement point A illustrates the phase error at the output of the phase detector PD over time. As can be seen, when the incoming data stream is first received, a large phase error is generated by the phase detector due to the misalignment between the VCO phase generated at the output of the voltage-controlled oscillator VCO and the phase of the incoming data stream. As the VCO phase is adjusted, the phase error grows smaller until the VCO phase is aligned with the phase of the incoming data stream, at which point no error exists at measurement point A.

While the PLL 301 is performing phase detection on the incoming data stream, the incoming data stream is simultaneously being received by the sample selector. The VCO phase generated by the voltage-controlled oscillator VCO is transmitted to the sample selector to sample the incoming data stream and generate a data stream sample at its output. Because the VCO phase is not initially aligned with the phase of the incoming data stream, the sample selector samples the incoming data unreliably and much of the incoming data stream is lost. It is not until the voltage-controlled oscillator VCO generates a VCO phase that is aligned with the phase of the incoming data stream that the incoming data stream is reliably sampled. In other words, the conventional receiver 300 has a positive locking time (i.e., the time between the start of data stream sampling and the time at which the phase of the data stream is detected is positive) and as such incoming data is lost due to the delay in detecting phase.

Figure 5:
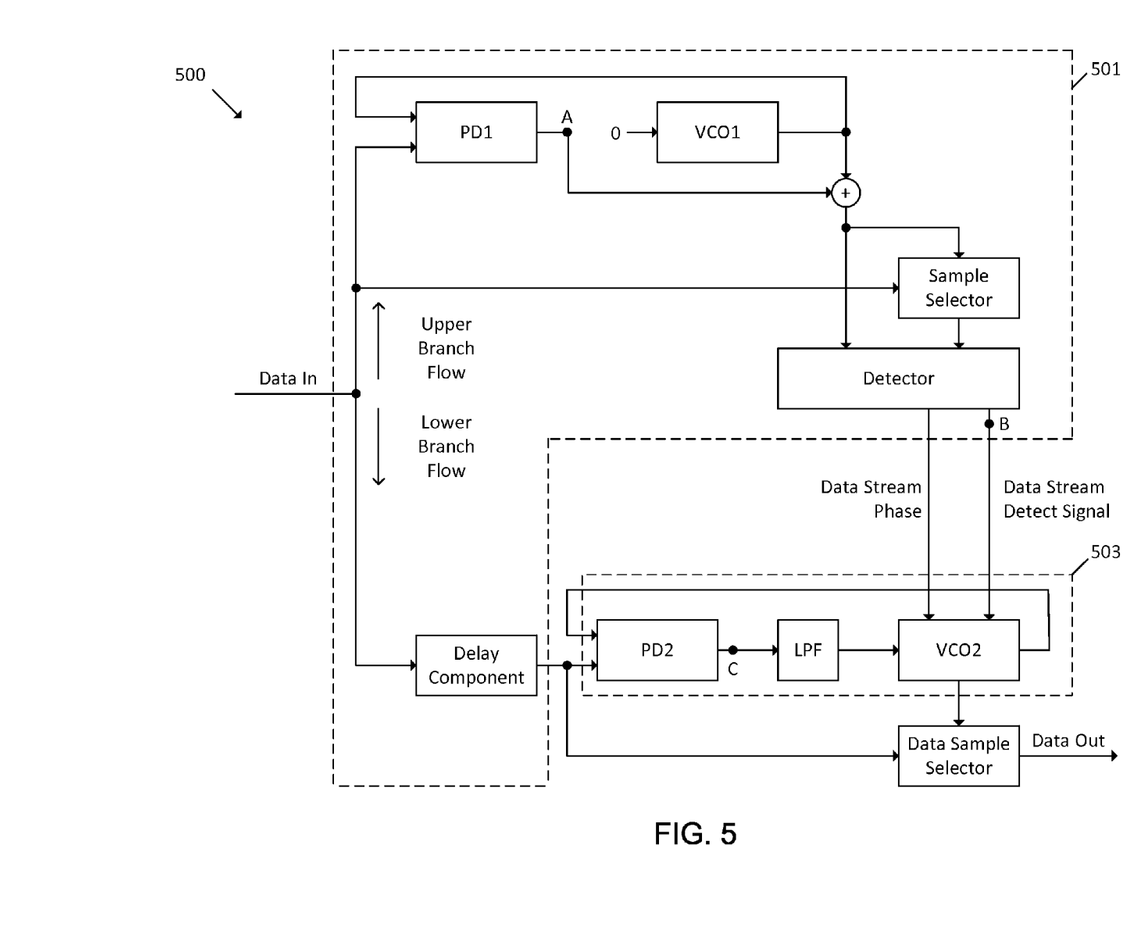
FIG. 5 illustrates an example of a receiver for a bursty data system.

FIG. 5 illustrates a receiver 500 for a bursty data system. The receiver 500 includes a bursty phase detector 501, a phase-locked-loop (PLL) 503, and a data sample selector. The bursty phase detector 501 performs phase detection on an incoming data stream and presets the phase of the PLL 503 to be aligned with the data stream prior to sampling by a sample selector. In this way, the receiver 500 of FIG. 5 is able to perform phase detection with a 0 or negative locking time, which will be discussed in further detail below. Optionally, the incoming data stream may include a preamble segment and a data segment.

The bursty phase detector 501 includes an upper branch and a lower branch. The upper branch includes a voltage-controlled oscillator VCO1, a phase detector PD1, a sample selector, an adder and a signal stream detector. The lower branch includes a delay component.

The phase detector PD1 of the bursty phase detector 501 includes a first input coupled to receive the incoming data stream, a second input coupled to an output of the voltage-controlled oscillator VCO1 of the bursty phase detector 501, and an output coupled to the adder. The phase detector PD1 of the bursty phase detector 501 is configured to generate a phase error at its output. The phase error is based on a comparison between the phase of the incoming data stream and a VCO phase output by the voltage-controlled oscillator VCO1 of the bursty phase detector 501. As will be discussed below, the voltage-controlled oscillator VCO1 of the bursty phase detector 501 is fixed and generates a fixed VCO phase. As such the phase error generated by the phase detector PD1 of the bursty phase detector 501 will be fixed. In some cases where the incoming data stream includes both a preamble segment and a data segment, the phase detector PD1 of the bursty phase detector 501 may be configured to generate a phase error based on a comparison between the phase of the preamble segment and the VCO phase generated by the voltage-controlled oscillator VCO1 of the bursty phase detector 501. In other embodiments, the phase detector PD1 of the bursty phase detector 501 may be configured to generate a phase error based on a comparison between the phase of the data segment and the phase generated by the voltage-controlled oscillator VCO1 of the bursty phase detector 501.

The voltage-controlled oscillator VCO1 of the bursty phase detector 501 is free-running and as such its input is tied to a fixed value. The output of the voltage-controlled oscillator VCO of the bursty phase detector 501 is coupled to the adder. The voltage-controlled oscillator VCO1 of the bursty phase detector 501 is configured to generate a fixed VCO phase at its output based on the fixed value tied to its input.

The adder includes a first input coupled to the output of the voltage-controlled oscillator VCO1 of the bursty phase detector 501 (e.g., fixed VCO phase) and a second input coupled to the output of the phase detector PD1 of the bursty phase detector 501 (e.g., fixed phase error). The adder combines the VCO phase and the phase error to generate the runtime phase of the incoming data stream at its output. In some cases where the incoming data stream includes both a preamble segment and a data segment, the runtime phase generated by the adder may be the runtime phase of the preamble segment. In other embodiments, the runtime phase generated by the adder may be the runtime phase of the data segment.

The sample selector of the bursty phase detector 501 includes a first input coupled to an output of the adder, a second input coupled to receive the incoming data stream, and an output coupled to the signal stream detector. The sample selector is configured to sample the incoming data stream using the runtime phase of the incoming data stream (e.g., combined VCO phase and phase error) to generate a data stream sample at its output. In some cases where the incoming data stream includes both a preamble segment and a data segment, the data stream sample may be a sample of the preamble segment. In some other, the data stream sample may be a sample of the data segment.

The signal stream detector of the bursty phase detector 501 includes a first input coupled to an output of the adder and a second input coupled to the output of the sample selector. The signal stream detector is configured to generate a data stream phase at a first output and a data stream detect signal at a second output using the runtime phase of the incoming data stream (e.g. combined VCO phase and phase error) as well as the data stream sample. The data stream phase is the phase of the incoming data stream. The data stream detect signal is an indication of the start of incoming data from a new transmitter. In some cases where the incoming data stream includes both a preamble segment and a data segment, the data stream phase may be a preamble segment phase and the data stream detect signal may be a preamble segment detect signal. In other embodiments, the data stream phase may be a data segment phase. Optionally, the preamble segment may be used to trigger the data stream detect signal.

The delay component of the bursty phase detector 501 stores the incoming data stream while the upper branch performs phase detection. Once the phase of the incoming data stream has been detected by the upper branch, the delay component releases the incoming data stream to the PLL 503 and the data sample detector.

During operation, incoming data streams enter the receiver 500 and flow into the upper branch as well as the lower branch. In the upper branch, the incoming data stream is detected and the phase of the incoming data stream is determined. The time it takes to detect the incoming data stream and to determine the phase of the incoming data stream is known as processing time. In the lower branch, the incoming data stream is stored in the delay component until the upper branch detects the incoming data stream and determines its phase. Optionally, the delay component may store the data stream for a time period equal to the processing time. In other embodiments, the delay component stores the data stream for a time period greater than the processing time.

Once the signal stream detector of the bursty phase detector 501 has detected the phase of the incoming data stream, the signal stream detector injects that phase into the voltage-controlled oscillator VCO2 of the PLL 503, such that the VCO phase generated by the voltage-controlled oscillator VCO2 of the PLL 503 is aligned with the phase of the incoming data stream.

The PLL 503 includes a phase detector PD2, a low-pass filter LPF, and a voltage-controlled oscillator VCO2.

The phase detector PD2 of the PLL 503 includes a first input coupled to the output of the delay (e.g., delayed incoming data stream) and a second input coupled to an output of the voltage-controlled oscillator VCO2 of the PLL 503. The phase detector PD2 of the PLL 503 is configured to generate a phase error at its output.

The low-pass filter LPF includes an input coupled to the output of the phase detector PD2 and an output coupled to an input of the voltage-controlled oscillator VCO2. The low-pass filter LPF is configured to remove local noise associated with the output of the phase detector.

The voltage-controlled oscillator VCO2 of the PLL 503 includes a first input coupled to the low-pass filter LPF, a second input coupled to the data stream phase signal generated by the signal stream detector, a third input coupled to receive the data stream detect signal generated by the signal stream detector, and an output coupled to the phase detector PD2 of the PLL 503 as well as the data sample selector. The voltage-controlled oscillator VCO2 of the PLL 503 generates a VCO phase at its output which is coupled to the second input of the phase detector PD2 of the PLL 503 and the data sample selector. The voltage-controlled oscillator VCO2 of the PLL 503 generates the VCO phase at its output based on the output of the low-pass filter LPF (e.g., phase error filtered to remove local noise), the data stream phase, and the data stream detect signal, as described in greater detail below.

As mentioned above, once the signal stream detector in the upper branch has detected the phase of the incoming data stream, the signal stream detector injects that phase into the voltage-controlled oscillator VCO2 of the PLL 503, such that the VCO phase generated by the voltage-controlled oscillator VCO2 of the PLL 503 is aligned with the phase of the incoming data stream. Thus, when the phase detector PD2 of the PLL 503 compares the phase of the incoming data stream to the VCO phase generated by the voltage-controlled oscillator VCO2 of the PLL 503, a minimal phase error is generated. This minimal phase error is passed to the low-pass filter LPF which removes local noise before being received by the voltage-controlled oscillator VCO2 of the PLL 503. Because the low-pass filtered phase error is minimal, the voltage-controlled oscillator VCO2 of the PLL 503 continues to generate a VCO phase that is aligned with the phase of the incoming data.

The data sample selector receives the incoming data stream from the output of the delay component at the same time that the PLL 503 receives the incoming data stream. The data sample selector is also coupled to the output of the voltage-controlled oscillator VCO2 of the PLL 503 and uses the VCO phase generated by the voltage-controlled oscillator VCO2 to sample the incoming data stream. Because the VCO phase generated by the voltage-controlled oscillator VCO2 of the PLL 503 is aligned with the phase of the incoming data stream at the time the data sample selector begins receiving the incoming data stream, the incoming data stream is reliably sampled without any data loss.

Figure 6:
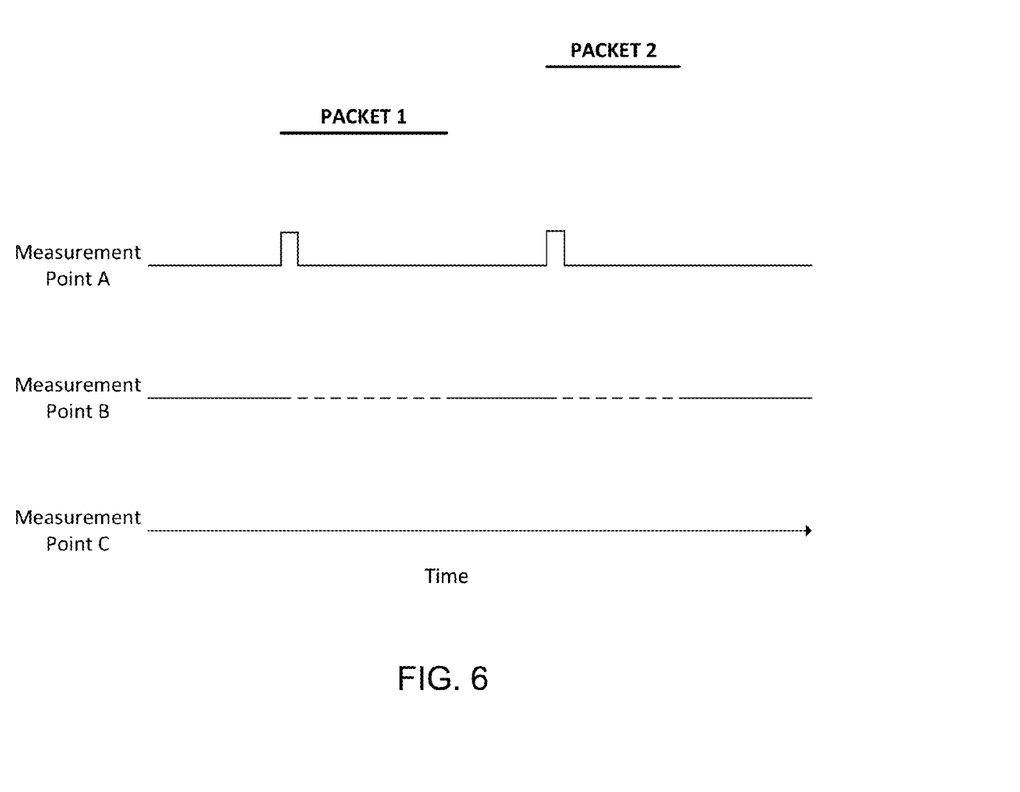
FIG. 6 is a graphical illustration of the behavior of the receiver of FIG. 5.

FIG. 6 is a graphical illustration of the behavior of the receiver 500 of FIG. 5. As soon as the incoming data stream flows into the upper branch, its phase is compared against the VCO phase generated by the voltage-controlled oscillator VCO1 of the bursty phase detector 501 to generate a phase error at measurement point A in FIG. 5. This phase error is illustrated in FIG. 6. Because the VCO phase is fixed, as described above, so too is the phase error. The phase error is combined with the VCO phase at the adder to generate the runtime phase of the incoming data stream at the output of the adder as shown in of FIG. 5.

As described above, the sample selector of the bursty phase detector 501 is configured to sample the incoming data stream using the runtime phase of the incoming data (e.g., combined VCO phase and phase error) to generate a data stream sample at its output. The signal stream detector of the bursty phase detector 501 is configured to generate a data stream phase at a first output and a data stream detect signal at a second output (i.e., measurement point B) using the combined VCO phase and phase error (i.e., runtime phase of the incoming data stream) as well as the data stream sample as described above. The data stream detect signal at measurement point B is illustrated in FIG. 6. In some cases where the incoming data stream includes a preamble segment and a data segment, the data stream detect signal is a signal that indicates a preamble segment has been detected and not a data segment.

The data stream phase and the data stream detect signal are output to the PLL 503 which aligns the VCO phase generated by the voltage-controlled oscillator VCO2 of the PLL 503 with the phase of the incoming data stream. Thus, when the incoming data stream is output from the delay component in the lower branch to the phase detector PD2 of the PLL 503, the phase error generated by the output of the phase detector PD2 of the PLL 503 at measurement point C will be minimal as illustrated in FIG. 6. This is because the point at which the receiver 500 detects the phase of the incoming data stream occurs at the same time or earlier than the start of data sampling by the data sample selector. In other words, the locking time for the receiver 500 is 0 or negative. This is in contrast to the phase error output by the phase detector of the PLL 301 in FIG. 3, where a positive locking time is involved.

Thus, the receiver 500 of FIG. 5 has the ability to perform phase detection with a 0 or negative locking time, thus ensuring that data loss doesn't occur during sampling. Additionally, the receiver 500 of FIG. 5 may be implemented with standard electronics without any speed requirements. Rather than dedicating custom electronics with a high operating speed and high cost for performing phase detection, standard electronics that operate at any speed may be used. This reduces costs and allows for flexible operation of the receiver 500. Moreover, the receiver 500 of FIG. 5 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

Figure 7:
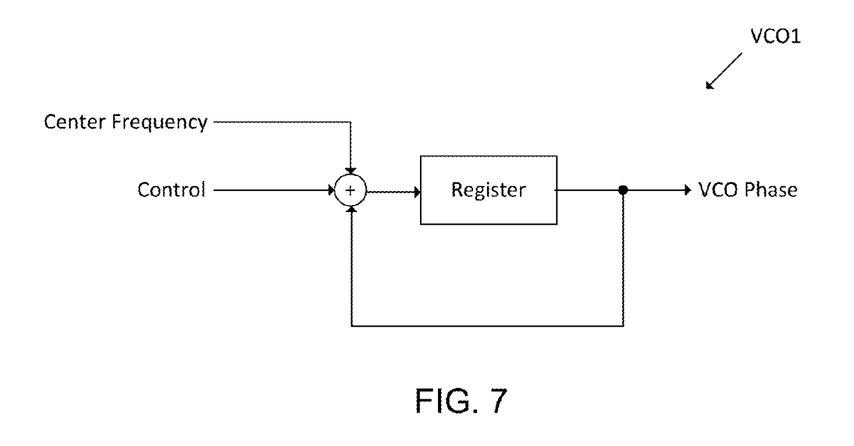
FIG. 7 illustrates a detailed view of the voltage controller oscillator VCO1 of the bursty phase detector in FIG. 5.

FIG. 7 illustrates a detailed view of the voltage controller oscillator VCO1 of the bursty phase detector 501 in FIG. 5. The voltage-controlled oscillator VCO1 includes a register and an adder. An input of the register is coupled to the output of the adder and an output of the register is coupled to a first input of the adder. The adder also includes a second input coupled to receive a control signal and a third input coupled to receive a center frequency signal.

The control signal received by the voltage-controlled oscillator VCO1 is that shown in FIG. 5. In FIG. 5, the control signal being received by the voltage-controlled oscillator VCO1 is a fixed value (e.g., 0). The center frequency signal is not shown in FIG. 5 and is a value that is set internally based on the operating frequency of the transmitters that are time-sharing the receiver. The voltage-controlled oscillator VCO1 generates a VCO phase at its output based on the center frequency signal, control signal, and output of the register. The VCO phase generated by the voltage-controlled oscillator VCO1 changes as the control signal being received by the adder changes. However, because the voltage-controlled oscillator VCO1 of the bursty phase detector 501 in FIG. 5 is controlled by a fixed value control signal, the VCO phase generated at the output of the voltage-controlled oscillator VCO1 remains fixed.

Figure 8:
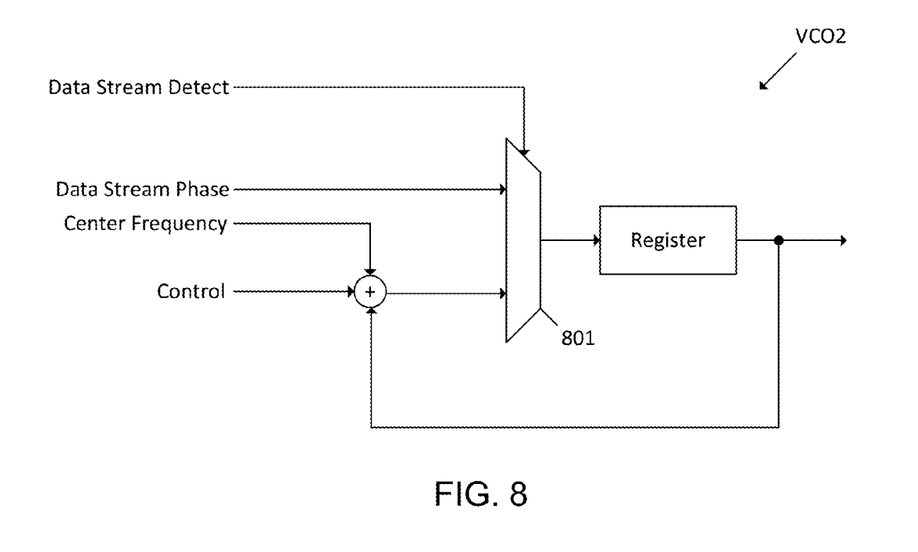
FIG. 8 illustrates a detailed view of the voltage controller oscillator VCO2 of the PLL in FIG. 5.

FIG. 8 illustrates a detailed view of the voltage controller oscillator VCO2 of the PLL 503 in FIG. 5. The voltage-controlled oscillator VCO2 includes a register, a multiplexer 801, and an adder. An input of the register is coupled to the output of the multiplexer 801 and an output of the register is coupled to a first input of the adder. A first input of the multiplexer 801 is coupled to receive the data stream phase signal generated by the signal stream detector of the bursty phase detector 501, a second input of the multiplexer 801 is coupled to an output of the adder, and a control input of the multiplexer 801 is coupled to receive the data stream detect signal generated by the signal stream detector of the bursty phase detector 501. The adder also includes a second input coupled to receive a control signal and a third input coupled to receive a center frequency signal.

The control signal received by the voltage-controlled oscillator VCO2 is that shown in FIG. 5, namely the output of the low-pass filter LPF (e.g., phase error filtered for noise). The center frequency signal is not shown in FIG. 5 and is a value that is set internally based on the operating frequency of the transmitters that are time-sharing the receiver. When the signal stream detector in the burst phase detector 501 generates a data stream detect signal, it causes the multiplexer 801 of the voltage-controlled oscillator VCO2 of the PLL2 to select the data stream phase and as such the voltage-controlled oscillator VCO2 generates a VCO phase at its output that is aligned with the phase of the incoming data stream. The VCO phase generated at the output of the voltage-controlled oscillator VCO2 of the PLL 503 continues to be aligned with the phase of the incoming data stream until a different data stream detect signal is received by the voltage-controlled oscillator VCO2 of the PLL 503.

As already mentioned above, the receiver 500 of FIG. 5 has several advantages over the prior techniques for handling bursty data systems. The receiver 500 of FIG. 5 has the ability to perform phase detection with a 0 or negative locking time, thus ensuring that data loss doesn't occur during sampling. Additionally, the receiver 500 of FIG. 5 may be implemented with standard electronics without any speed requirements. Rather than dedicating custom electronics with a high operating speed and high cost for performing phase detection, standard electronics that operate at any speed may be used. This reduces costs and allows for flexible operation of the receiver. Moreover, the receiver 500 of FIG. 5 may be configured to perform phase detection on incoming data streams with or without preamble segments. This provides for flexible operation of the receiver and may also reduce bandwidth consumption in situations where the incoming data stream does not include a preamble segment. Preamble segments are not constrained to be a certain length and may be adjusted depending on the particular application.

As used in this specification, the term "output" may refer to an output signal, or a physical output (e.g., port, node, connection, etc.) of a component. Similarly, the term "input" may refer to an input signal, or a physical input (e.g., port, node, connection, etc.) of a component.

Although particular embodiments have been shown and described, it will be understood that they are not intended to limit the claimed invention, and it will be clear to those skilled in the art that various changes and modifications may be made without departing from the claimed invention. The specification and drawings are, accordingly, to be regarded in an illustrative rather than restrictive sense. The claimed invention is intended to cover modifications and alternatives.

What is claimed is:

1. A bursty phase detector for processing a data stream, comprising:
    an upper branch, including:
        a voltage-controlled oscillator (VCO) configured to provide a VCO phase at an output of the VCO;
        a phase detector with a first input coupled to receive the data stream and a second input coupled to the output of the VCO, the phase detector configured to provide a phase error at its output;
        a sample selector with a first input coupled to receive a sum of the VCO phase and the phase error, and a second input coupled to receive the data stream, the sample selector configured to provide a data stream sample at its output; and
        a data stream detector with a first input coupled to receive the sum of the VCO phase and the phase error, and a second input coupled to the output of the sample selector, the data stream detector configured to generate a data stream phase and a data stream detect signal; and
    a lower branch, including a delay component with an input coupled to receive the data stream.

2. The bursty phase detector of claim 1, wherein the data stream comprises a preamble segment and a data segment.

3. The bursty phase detector of claim 2, wherein the preamble segment is for triggering the data stream detect signal.

4. The bursty phase detector of claim 1, wherein the VCO has an input coupled to a fixed control signal.

5. The bursty phase detector of claim 1, wherein the phase detector is configured to provide the phase error by comparing a phase of the data stream to the VCO phase.

6. The bursty phase detector of claim 1, further comprising an adder for generating the sum of the VCO phase and the phase error.

7. The bursty phase detector of claim 1, wherein the sum of the VCO phase and the phase error carries a runtime phase of the data stream.

8. The bursty phase detector of claim 1, wherein the delay component is configured to store the data stream for a time period greater than, or equal to, a processing time for generating the data stream phase and the data stream detect signal.

9. The bursty phase detector of claim 1, wherein the data stream detect signal provides an indication of a start of the data stream.

10. A receiver for processing a data stream, comprising:
a bursty phase detector including an upper branch and a lower branch;
wherein the upper branch comprises:
a first voltage-controlled oscillator (VCO) configured to provide a first VCO phase at an output of the VCO;
a first phase detector with a first input coupled to receive the data stream, and a second input coupled to the output of the first VCO, the first phase detector configured to provide a first phase error at its output;
a sample selector with a first input coupled to receive a sum of the first VCO phase and the first phase error, and a second input coupled to receive the data stream, the sample selector configured to provide a data stream sample at its output; and
a signal stream detector with a first input coupled to receive the sum of the first VCO phase and the first phase error, and a second input coupled to the output of the sample selector, the signal stream detector configured to generate a data stream phase and a data stream detect signal;
wherein the lower branch comprises a delay component with an input coupled to receive the data stream;
a phase locked loop (PLL) coupled to receive an output of the delay element, the data stream phase, and the data stream detect signal, the PLL configured to provide a second VCO phase at an output of the PLL; and
a data sample selector with a first input coupled to the output of the delay component, and a second input coupled to the output of the PLL.

11. The receiver of claim 10, wherein the data stream comprises a preamble segment and a data segment.

12. The receiver of claim 10, further comprising an adder for generating the sum of the first VCO phase and the first phase error.

13. The receiver of claim 10, wherein the delay component is configured to store the data stream for a time period greater than, or equal to, a processing time for generating the data stream phase and the data stream detect signal.

14. The receiver of claim 10, wherein the PLL comprises:
a low-pass filter;
a second VCO with a first input coupled to an output of the low-pass filter, a second input coupled to receive the data stream phase, and a third input coupled to receive the data stream detect signal;
wherein the second VCO is configured to provide a second VCO phase at its output; and
a second phase detector with a first input coupled to the output of the delay component, a second input coupled to the output of the second VCO, and an output coupled to the low-pass filter.

15. The receiver of claim 14, wherein the second phase detector is configured to receive the data stream from the delay component after the second VCO phase is aligned with a phase of the data stream.

16. The receiver of claim 14, wherein the second VCO comprises:
an adder coupled to the output of the low-pass filter and further coupled to receive a center frequency signal;
a multiplexer with a first input coupled to receive the data stream phase, a second input coupled to an output of the adder, and a control input coupled to receive the data stream detect signal; and
an n-bit register with an input coupled to an output of the multiplexer, and an output coupled to an input of the adder.

17. The receiver of claim 16, wherein the multiplexer is configured to select the data stream phase upon receipt of the data stream detect signal.

18. The receiver of claim 14, wherein the low-pass filter is configured to remove local noise associated with the output of the second phase detector.

19. The receiver of claim 14, wherein the second VCO phase provided at the output of the second VCO is aligned with a phase of the data stream using the data stream phase generated by the signal stream detector.

20. The receiver of claim 10, wherein the data stream detect signal provides an indication of a start of the data stream.

* * * * *